(12) United States Patent
Moosburger et al.

(10) Patent No.: US 10,115,868 B2
(45) Date of Patent: Oct. 30, 2018

(54) OPTOELECTRONIC SEMICONDUCTOR CHIP, OPTOELECTRONIC COMPONENT, AND METHOD OF PRODUCING SEMICONDUCTOR CHIPS

(71) Applicant: OSRAM Opto Semiconductors GmbH, Regensburg (DE)

(72) Inventors: Jürgen Moosburger, Lappersdorf (DE); Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/906,581

(22) PCT Filed: Jul. 23, 2014

(86) PCT No.: PCT/EP2014/065850
§ 371 (c)(1),
(2) Date: Jan. 21, 2016

(87) PCT Pub. No.: WO2015/011205
PCT Pub. Date: Jan. 29, 2015

(65) Prior Publication Data
US 2016/0172546 A1    Jun. 16, 2016

(30) Foreign Application Priority Data
Jul. 25, 2013  (DE) .......................... 10 2013 107 967

(51) Int. Cl.
*H01L 33/48* (2010.01)
*H01L 33/22* (2010.01)
*H01L 33/60* (2010.01)
*H01L 33/62* (2010.01)

(52) U.S. Cl.
CPC ............ *H01L 33/483* (2013.01); *H01L 33/22* (2013.01); *H01L 33/60* (2013.01); *H01L 33/62* (2013.01)

(58) Field of Classification Search
CPC ....... H01L 33/483; H01L 33/62; H01L 33/60; H01L 33/22
See application file for complete search history.

(56) References Cited

U.S. PATENT DOCUMENTS 5,429,954 A *  7/1995  Gerner ................... H01L 33/22
                                                                          257/13
6,410,942 B1 *  6/2002  Thibeault ............... B82Y 20/00
                                                                          257/79

(Continued)

FOREIGN PATENT DOCUMENTS

CN          1874018          12/2006
CN         101807637          8/2010

(Continued)

OTHER PUBLICATIONS

Soggs et al., EE539A: Physics and Modeling of VLSI Fabrication, "Modeling and Simulation Feasibility Study of the Bosch DRIE (Deep Reactive Ion Etch) Process as performed in the WTC (Washington Technology Center)", Jun. 13, 2003, pp. 1-18.*

(Continued)

*Primary Examiner* — Yu Chen
*Assistant Examiner* — Vincent Wall
(74) *Attorney, Agent, or Firm* — DLA Piper LLP (US)

(57) ABSTRACT

An optoelectronic semiconductor chip includes a carrier and a semiconductor body having an active layer that generates electromagnetic radiation, wherein the semiconductor body is arranged on the carrier, the semiconductor body has a first main surface facing away from the carrier and a second main surface facing the carrier, the semiconductor chip has a side surface having an anchoring structure, and the second main surface is arranged between the first main surface and the anchoring structure.

13 Claims, 6 Drawing Sheets

(56) References Cited

U.S. PATENT DOCUMENTS

| | | | |
|---|---|---|---|
| 8,951,915 B2* | 2/2015 | Hess | H01L 21/30655 257/E29.002 |
| 2007/0126019 A1 | 6/2007 | Yamada et al. | |
| 2008/0315232 A1* | 12/2008 | Matsuo | H01L 33/46 257/98 |
| 2009/0230423 A1 | 9/2009 | Huang | |
| 2012/0098016 A1* | 4/2012 | Hoppel | H01L 33/44 257/98 |
| 2012/0261693 A1 | 10/2012 | Chen | |
| 2013/0187179 A1 | 7/2013 | Tan et al. | |
| 2013/0187188 A1 | 7/2013 | Sasaoka et al. | |
| 2016/0365484 A1 | 12/2016 | Jeong et al. | |

FOREIGN PATENT DOCUMENTS

| | | |
|---|---|---|
| CN | 101989641 | 3/2011 |
| CN | 102194929 | 9/2011 |
| CN | 102376827 | 3/2012 |
| CN | 102544272 | 7/2012 |
| CN | 102956765 | 3/2013 |
| CN | 103219441 | 7/2013 |
| DE | 43 05 296 A1 | 8/1994 |
| JP | 2012-044104 A | 3/2012 |
| WO | 02/41364 A2 | 5/2002 |

OTHER PUBLICATIONS

Roxhed et al., "a method of tapered deep reactive ion etching using a modified Bosch Process", J. micormech. Microeng. 17 (2007) 1087-1092.*

Notification of the First Office Action dated Apr. 12, 2017, of corresponding Chinese Application No. 20 480041995.5 in English.

The Second Office Action dated Jan. 9, 2018, of corresponding Chinese Application No. 201480041995.4, along with an English translation.

* cited by examiner

OPTOELECTRONIC SEMICONDUCTOR CHIP, OPTOELECTRONIC COMPONENT, AND METHOD OF PRODUCING SEMICONDUCTOR CHIPS

TECHNICAL FIELD

This disclosure relates to an optoelectronic semiconductor chip, an optoelectronic component and a method of producing a plurality of optoelectronic semiconductor chips.

BACKGROUND

A conventional optoelectronic component comprising an optoelectronic semiconductor chip embedded into a molding compound often has inadequate stability between the semiconductor chip and the molding compound on account of the poor adhesion of the molding compound to the semiconductor chip.

It could therefore be helpful to provide an optoelectronic semiconductor chip whose structural constitution is suitable for increasing the stability of the optoelectronic component comprising such a semiconductor chip as well as a method of producing a plurality of such semiconductor chips.

SUMMARY

We provide an optoelectronic semiconductor chip including a carrier and a semiconductor body having an active layer that generates electromagnetic radiation, wherein the semiconductor body is arranged on the carrier, the semiconductor body has a first main surface facing away from the carrier and a second main surface facing the carrier, the semiconductor chip has a side surface having an anchoring structure, and the second main surface is arranged between the first main surface and the anchoring structure.

We also provide an optoelectronic component including the semiconductor chip including a carrier and a semiconductor body having an active layer that generates electromagnetic radiation, wherein the semiconductor body is arranged on the carrier, the semiconductor body has a first main surface facing away from the carrier and a second main surface facing the carrier, the semiconductor chip has a side surface having an anchoring structure, and the second main surface is arranged between the first main surface and the anchoring structure, and a housing body, wherein the housing body encloses the semiconductor chip in a lateral direction such that the housing body engages into the anchoring structure, the housing body completely covers the side surface at least between a rear side of the semiconductor chip and the second main surface, and the first main surface is free of the housing body.

We further provide an optoelectronic component including the semiconductor chip including a carrier and a semiconductor body having an active layer that generates electromagnetic radiation, wherein the semiconductor body is arranged on the carrier, the semiconductor body has a first main surface facing away from the carrier and a second main surface facing the carrier, the semiconductor chip has a side surface having an anchoring structure, and the second main surface is arranged between the first main surface and the anchoring structure, and an optical element, wherein the optical element encloses the semiconductor chip in a lateral direction such that the optical element engages into the anchoring structure, the optical element has the form of a lens, and the optical element completely covers the first main surface and the side surface.

We further yet provide a method of producing a plurality of optoelectronic semiconductor chip including A) providing a plurality of semiconductor bodies on a common carrier plate, wherein the semiconductor bodies are separated from one another by at least one trench, and the semiconductor bodies have an active layer that generates electromagnetic radiation between a first main surface facing away from the common carrier plate and a second main surface facing the common carrier plate; B) forming an anchoring structure, wherein the second main surface is arranged between the first main surface and the anchoring structure; and C) singulating the plurality of semiconductor chips along the at least one trench such that the singulated semiconductor chips include a semiconductor body, a carrier and a side surface having an anchoring structure, wherein the carriers of the semiconductor chips are formed from the common carrier plate by the singulation.

We also further provide an optoelectronic semiconductor chip including a carrier and a semiconductor body having an active layer that generates electromagnetic radiation, wherein the semiconductor body is arranged on the carrier, the semiconductor body has a first main surface facing away from the carrier and a second main surface facing the carrier, the semiconductor chip has a side surface having an anchoring structure, the second main surface is arranged between the first main surface and the anchoring structure, the side surface has roughnesses, and the anchoring structure includes a plurality of indentations, wherein a cross section and a depth of the indentations are at least three times larger than a corresponding cross section and a corresponding depth of the roughnesses of the side surface, respectively.

DETAILED DESCRIPTION

Our optoelectronic semiconductor chip may comprise a carrier and a semiconductor body. The semiconductor body contains an active layer that generates electromagnetic radiation during operation of the optoelectronic semiconductor chip. The semiconductor body is arranged on the carrier. The semiconductor body has a first main surface facing away from the carrier and a second main surface facing the carrier. The semiconductor chip has a side surface having an anchoring structure, wherein the second main surface is arranged in particular between the first main surface and the anchoring structure.

If a molding compound, for example, is molded around the optoelectronic semiconductor chip for instance by compression molding or transfer molding for the purpose of forming a housing body, then the housing body can engage into the anchoring structure, as a result of which the stability of the composite assembly comprising the optoelectronic semiconductor chip and the housing body is increased. If the housing body is fixed to the semiconductor chip only laterally, engagement of the molding compound in the anchoring structure reduces the risk of the semiconductor chip becoming detached from the housing body.

An anchoring structure is understood to mean, in particular, a structure on the side surface of the semiconductor chip, wherein the anchoring structure offers anchoring possibilities to a material surrounding the semiconductor chip. Manufacturing-dictated roughnesses on the side surface arising within the scope of the production tolerances during a singulation process, in particular during a laser separation process or an etching process, are not regarded as part of the anchoring structure.

The semiconductor body has, in particular, a first semiconductor layer of a first conduction carrier type and a second semiconductor layer of a second conduction carrier type, wherein the active layer is arranged between the first semiconductor layer and the second semiconductor layer. In particular, the active layer is a p-n junction zone. In this case, the active layer can be one layer or a layer sequence of a plurality of layers. The semiconductor body contains, in particular, only semiconductor layers deposited epitaxially on a growth substrate.

The semiconductor body is delimited by the first main surface and by the second main surface, for example, in a vertical direction. A vertical direction is understood to mean a direction directed perpendicular to a main extension plane of the active layer. In particular, the vertical direction is directed parallel to a growth direction of the semiconductor layers of the semiconductor body.

The semiconductor body has an outer surface delimiting the semiconductor body in a lateral direction. A lateral direction means a direction directed parallel to the main extension plane of the active layer. The lateral direction and the vertical direction are thus orthogonal to one another. The outer surface of the semiconductor body is a part of the side surface of the semiconductor chip, wherein the outer surface of the semiconductor body is delimited by the first main surface and by the second main surface, for example, in the vertical direction. In particular, the outer surface of the semiconductor body is free of an anchoring structure.

The first main surface of the semiconductor body is preferably a radiation exit surface of the semiconductor chip. In other words, the electromagnetic radiation generated in the active layer emerges from the optoelectronic semiconductor chip through the first main surface of the semiconductor body. It is also possible for the carrier to be radiation-transmissive. In this case, the radiation generated by the active layer can emerge from the optoelectronic semiconductor chip through the second main surface and through the carrier.

The anchoring structure may contain at least one indentation. The indentation is formed in the carrier of the semiconductor chip. By way of example, the indentation is a lateral incision into the carrier. The incision can have in particular a lateral extent corresponding to at least 0.1%, preferably at least 0.5%, of the lateral extent of the entire carrier. In other words, in the region of the indentation, the carrier can have a lateral extent corresponding to at most 95%, preferably at most 90%, of the lateral extent of the carrier in regions that are free of an indentation and/or anchoring structures. In particular, the at least one indentation is spatially spaced apart from the second main surface of the semiconductor body in a vertical direction. By way of example, the indentation is formed by an etching process, for instance by a dry-chemical etching process. In particular, the indentation can be continuous in a lateral direction. In other words, the indentation extends all around the carrier and forms a closed depression on the side surface.

The anchoring structure enlarges the side surface of the semiconductor chip. If the semiconductor chip is surrounded by a molding compound, for example, for the purpose of forming a housing body, then the molding compound engages into the indentation, thereby increasing an interface between the housing body and the semiconductor chip. This increases the stability of the composite assembly comprising the semiconductor chip and the housing body. By the anchoring structure, the housing body is anchored with the semiconductor chip such that a mechanically stable, lateral connection between the semiconductor chip and the housing body is obtained and a sufficient stability is thereby imparted to the composite assembly, even if the first main surface and a rear side of the semiconductor chip are free of the molding compound or of the housing body.

The anchoring structure may contain a plurality of indentations. The indentations are formed in particular in the carrier, wherein the indentations are spatially spaced apart from one another in the vertical direction. By way of example, the indentations have different structure sizes such as depth and width. A depth of the indentation means, in particular, a lateral extent of the indentation into the carrier. A width of the indentation means, in particular, a vertical extent of the indentation on the side surface. In particular, the anchoring structure has indentations whose depth and/or width decrease(s) with increasing distance from the second main surface. It is also possible for the anchoring structure, with increasing distance from the second main surface, to have indentations having structure sizes having increasing depth and width. Furthermore, the indentations having different structure sizes can be distributed irregularly.

The structure size, for instance the depth or the width, may be 2 µm to 20 µm. In particular, the structure size may be 2 µm to 10 µm.

The semiconductor chip may comprise an intermediate layer. The intermediate layer is arranged between the semiconductor body and the carrier. In particular, the anchoring structure is at least regionally formed by the intermediate layer. In particular, the anchoring structure has a steplike structure, wherein the steplike structure is arranged between the second main surface and a rear side of the semiconductor chip. A steplike structure means, in particular, a structure on the side surface at least regionally formed by the intermediate layer and the carrier. For example, the steplike structure can be formed by virtue of the intermediate layer and the carrier having cross sections of different sizes. In particular, the carrier at least regionally has a larger cross section than the intermediate layer. Furthermore, the intermediate layer for the purpose of forming the steplike structure can have a cross section which, in particular, is larger than a cross section of the semiconductor body and is smaller than a cross section of the carrier at the rear side of the carrier.

The thickness of the intermediate layer may be 1 µm to 10 µm. The thickness of the intermediate layer means, in particular, a vertical extent of the intermediate layer. In particular, the thickness of the intermediate layer is between 3 µm to 7 µm. The steplike structure has a lateral extent and a vertical extent. In particular, the vertical extent of the steplike structure and the thickness of the intermediate layer are of the same magnitude. By way of example, the lateral extent of the steplike structure is 2 μm to 20 μm. In particular, the lateral extent is 2 μm to 10 μm.

It is also possible for the carrier to have a partial region closest to the intermediate layer and has a cross section identical to that of the intermediate layer. At the steplike structure, for example, a housing body can be anchored at the side surface of the semiconductor chip such that a sufficiently stable connection between the semiconductor chip and the housing body is formed, even if the first main surface of the semiconductor body and the rear side of the semiconductor chip are free of the housing body.

The semiconductor chip may comprise a first connection layer. The first connection layer electrically contacts the semiconductor chip. The first connection layer extends in particular from the side surface of the semiconductor chip to the first main surface of the semiconductor chip. For the purpose of electrical insulation between the first connection layer and the semiconductor body, an insulation layer is arranged at least regionally between the side surface and the first connection layer. During operation of the semiconductor chip, therefore, the first semiconductor layer of the semiconductor body can be connected to an external current source via the first main surface by the first connection layer. Preferably, the intermediate layer and the carrier electrically conductive. As a result, the second semiconductor layer can electrically connect to an external current source on the rear side, that is to say via the rear side of the semiconductor chip.

Preferably, the outer surface of the semiconductor body is formed obliquely relative to the second main surface. That means that the semiconductor body is trapezoidal in sectional view. The outer surface of the semiconductor body forms an acute internal angle, for example, with the second main surface. Consequently, the insulation layer and the first connection layer can be applied to the outer surface of the semiconductor body in a simplified manner. In particular, the insulation layer completely covers the steplike structure. The insulation layer adjoins in particular both the intermediate layer and the carrier.

A mirror layer may be arranged between the semiconductor body and the carrier. The mirror layer is reflective for the radiation generated during operation of the semiconductor chip. In particular, the mirror layer is completely surrounded by the insulation layer in a lateral direction. By reflection at the mirror layer, electromagnetic radiation is deflected in the direction of the radiation exit surface, as a result of which absorption of the electromagnetic radiation in the carrier is reduced.

The mirror layer may be completely surrounded by a first electrically insulating partial layer of the insulation layer in a lateral direction. In particular, in a plan view of the carrier, the semiconductor body at least partly covers the first electrically insulating partial layer and completely covers the mirror layer.

The semiconductor chip may be a thin-film semiconductor chip. The thin-film semiconductor chip is, in particular, free of a growth substrate. In other words, the carrier of the semiconductor chip is different than a growth substrate on which the semiconductor layers are grown epitaxially during production of the semiconductor chip.

An optoelectronic component may comprise an optoelectronic semiconductor chip and a molding compound. In particular, the molding compound can be an optical element, for instance a lens. The molding compound encloses the semiconductor chip in a lateral direction and engages in particular into the anchoring structure. For example, the molding compound completely covers the side surface of the semiconductor chip at least between a rear side of the semiconductor chip and the second main surface.

The first main surface of the semiconductor chip is free of the molding compound, for example. Preferably, the rear side of the semiconductor chip is free of the molding compound. In other words, the side surface of the semiconductor chip forms the sole interface between the semiconductor chip and the molding compound. The stability of the composite assembly comprising the semiconductor chip and a housing body formed from the molding compound is thus dependent on the constitution of the interface. As a result of the molding compound engaging into the anchoring structure, in particular into the indentation or into the steplike structure, the molding compound is anchored at the side surface of the semiconductor chip. The side surface of the semiconductor chip with the anchoring structure thus contributes to increasing the stability of the optoelectronic component. By way of example, the housing body and the semiconductor chip terminate flush with one another on the rear side of the semiconductor chip. Furthermore, the housing body can terminate flush with the first main surface of the semiconductor body. In particular, the semiconductor chip and the housing body have an identical height. Such a configuration of the semiconductor chip and the housing body makes it possible to achieve a mechanically stable optoelectronic component having a particularly small structural height.

The housing body may comprise an electrically insulating housing material or consists of the housing material. The housing material may be radiation-nontransmissive. The housing body protects the semiconductor chip in particular against environmental influences, for example, against moisture and against external mechanical influences. In particular, the housing body can be reflective for the radiation generated by the active layer. By way of example, the housing body contains titanium oxide.

An optoelectronic component may comprise a semiconductor chip and an optical element. The optical element encloses the semiconductor chip in a lateral direction such that the optical element engages into the anchoring structure. In particular, the optical element completely covers the first main surface and the side surface. Preferably, the optical element has the form of a lens. In particular, the semiconductor chip is arranged within the lens. For example, an optical axis of the optical element runs through the semiconductor chip. By the optical element, the radiation generated during operation of the semiconductor chip can be emitted homogeneously in all lateral directions.

In a method of producing a plurality of optoelectronic semiconductor chips, a plurality of semiconductor bodies may be provided on a common carrier plate. The semiconductor bodies comprise an active layer that generate electromagnetic radiation. The active layer is arranged between a main surface of the semiconductor body facing away from the common carrier plate and a second main surface of the semiconductor body facing the common carrier plate. The semiconductor bodies are separated from one another at least by one trench or by a plurality of trenches. An anchoring structure is formed, wherein the second main surface is arranged between the first main surface and the anchoring structure. Furthermore, the plurality of semiconductor chips are singulated along the at least one trench or the trenches. The singulated semiconductor chips comprise a semiconductor body, a carrier and a side surface having an anchoring structure. In particular, the carriers of the singulated semiconductor chips are formed from the common carrier plate by the singulation.

A molding compound may be molded around the optoelectronic semiconductor chips. The molding compound engages in particular into the anchoring structure. By way of example, the molding compound is a housing material. The housing material can be radiation-nontransmissive. In particular, the housing material can be radiation-reflecting. Alternatively, the molding compound can comprise or consist of a radiation-transmissive material. The radiation-transmissive material is suitable in particular to form an optical element, for instance, a lens. The optical element surrounds the semiconductor chip, in particular.

The anchoring structure may be formed during the process of singulating the semiconductor chips. In particular, the anchoring structure is formed during the process of separating the common carrier plate into individual carriers of the semiconductor chips. The process of forming the anchoring structure is preferably carried out by at least one isotropically acting chemical method and one anisotropically acting chemical method. In particular, the anchoring structure is formed in a vicinity of the trench. The trench is first enlarged in the vertical direction, for example, by the anisotropically acting chemical method. In other words, the depth of the trench increases in the vertical direction. In particular, the trench is then enlarged both in the lateral direction and in the vertical direction by the isotropically acting chemical method. In other words, the depth of the trench increases in the vertical direction, a cross section of the trench simultaneously being enlarged in places in the lateral direction.

By way of example, the semiconductor chips are severed by a dry-chemical etching process. In particular, during the etching process, a material of the common carrier plate in the region of the trench is removed dry-chemically. Furthermore, side walls of the etched trench can be coated with a protective layer that protects the side walls of the already etched trench against further etches.

The anchoring structure may be formed in a stepwise manner by alternately anisotropic and isotropic etches, in particular deep etches, along the at least one trench. In particular, the depth of the trench increases by anisotropic etches. In an isotropic etch, both the depth of the trench and a local cross section of the trench increase. In particular, the isotropic etch acts identically in all directions.

Preferably, an indentation is formed in the common carrier plate by the isotropic etch. By alternately anisotropic and isotropic etches, in particular dry-chemical deep etches, the depth of the trench increases, a plurality of indentations simultaneously being formed at the side walls of the trench. The side walls of the trench thus have an anchoring structure having a plurality of indentations. The indentations in the vertical direction are in particular spatially separated from one another. If a trench severs the common carrier plate, at least two semiconductor chips are separated from one another, wherein the semiconductor chips separated from one another have a side surface having an anchoring structure.

The anchoring structure may at least partly be formed before the process of singulating the semiconductor chips. In particular, at least one further method step is present between forming a part of the anchoring structure and singulating the semiconductor chips. By way of example, the further method step is applying an insulation layer to the already formed part of the anchoring structure. Furthermore, the further method step can be applying a connection layer that electrically contacts the semiconductor body.

An intermediate layer may be arranged between the semiconductor bodies and the common carrier plate. The intermediate layer can be a monolayer or multilayer. In particular, the anchoring structure has a steplike structure. In this case, the second main surface is arranged, for example, between the first main surface and the steplike structure. By way of example, the steplike structure is formed at least regionally by structuring of the intermediate layer. It is also possible for the steplike structure to pass into the common carrier plate. In other words, the common carrier plate is likewise structured during formation of the steplike structure. The method is particularly suitable for production of a semiconductor chip described above and/or of an optoelectronic component described above. Features described in association with the semiconductor chip and/or with the component can therefore also be used for the method, and vice versa.

Further advantages, preferred examples and developments of the optoelectronic semiconductor chip, the optoelectronic component and the method will become apparent from the examples explained below in association with FIGS. 1 to 8E.

Elements that are identical, of identical type or act identically are provided with identical reference signs in the figures. The figures are schematic illustrations and therefore not necessarily true to scale. Rather, comparatively small elements and in particular layer thicknesses may be illustrated with an exaggerated size for clarification.

Figure 1:
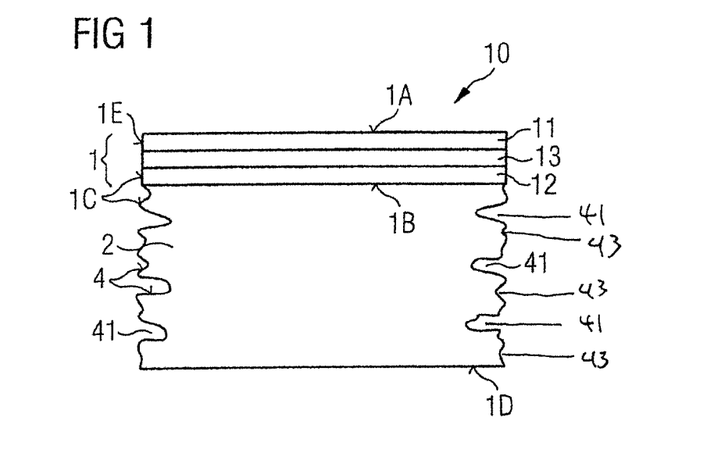
FIG. 1 shows one example of an optoelectronic semiconductor chip in schematic sectional view.

A first example of an optoelectronic semiconductor chip is illustrated in FIG. 1. The semiconductor chip 10 comprises a semiconductor body 1 and a carrier 2. The semiconductor body 1 is arranged on the carrier 2. The semiconductor body 1 has a first semiconductor layer 11 of a first charge carrier type, an active layer 13 and a second semiconductor layer 12 of a second charge carrier type. The active layer 13 generates electromagnetic radiation and is arranged between the first semiconductor layer 11 and the second semiconductor layer 12. The first semiconductor layer 11, the second semiconductor layer 12 and the active layer 13 can comprise one semiconductor layer or a plurality of semiconductor layers. The active layer 13 is, in particular, a p-n junction zone of the semiconductor body 1.

Further layers, for example, an intermediate layer or a mirror layer can be arranged between the semiconductor body 1 and the carrier 2. The semiconductor body has a first main surface 1A facing away from the carrier 2 and a second main surface 1B facing the carrier. The semiconductor body has an outer surface 1E, wherein the outer surface is directed perpendicular to the second main surface 1B. The carrier 2 can be a growth substrate on which the semiconductor layers of the semiconductor body 1 are epitaxially deposited. In particular, the carrier 2 is radiation-transmissive. By way of example, the semiconductor chip 10 is a volume emitter. Alternatively, the carrier 2 can be radiation-nontransmissive. In particular, the carrier 2 can be different than a growth substrate. By way of example, the carrier 2 comprises a semiconductor material such as silicon or germanium. Such a carrier composed of silicon or composed of germanium is particularly suitable for singulation by an etching process.

The semiconductor chip 10 has a rear side 1D. The rear side 1D is a surface of the carrier 2. In particular, the carrier 2 is electrically conductive. For example, a metallic rear-side contact can be applied to the rear side 1D. The semiconductor chip 10 can thus be electrically contacted on the rear side, that is to say via the rear side 1D. The semiconductor chip 10 has a side surface 1C. The side surface 1C contains an anchoring structure 4. The second main surface 1B is arranged between the first main surface 1A and the anchoring structure 4. The outer surface 1E of the semiconductor body is free from the anchoring structure 4.

The anchoring structure 4 contains a plurality of indentations 41. Alternatively, the anchoring structure can contain only one indentation 41. The indentations 41 are formed in the carrier 2. It is also possible for the side surface 1C to have protrusions forming an anchoring structure of the semiconductor chip. The indentations 41 are spatially spaced apart from one another in the vertical direction. Apart from the indentations 41, the side surface 1C has roughnesses 43 that arose during a singulation process. Such roughnesses 43 do not form an anchoring structure. Compared to the indentations 41, the roughnesses 43 have a smaller depth and a smaller cross section. By way of example, a cross section and a depth of the indentation are at least three times, in particular five times, as large as a cross section and a depth, respectively, of the roughnesses. By way of example, a structure size, for instance the depth or a width of the indentation, is 2 µm to 20 µm. In particular, the structure size is 2 µm to 10 µm.

Figure 2:
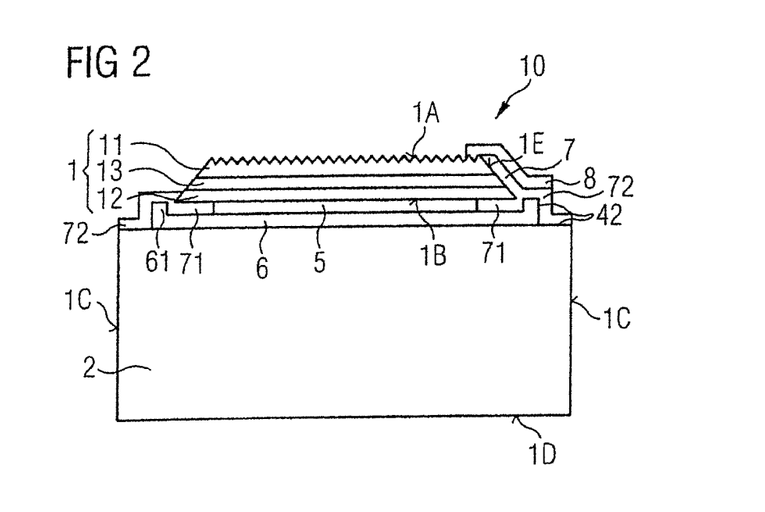
FIG. 2 shows a second example of an optoelectronic semiconductor chip in schematic sectional view.

FIG. 2 schematically illustrates a second example of an optoelectronic semiconductor chip. The structural construction of the semiconductor chip illustrated in this example substantially corresponds to the structural construction of the semiconductor chip described in the first example. In contrast thereto, the anchoring structure 4 has a steplike structure 42 instead of indentations 41. The steplike structure 42 in FIG. 2 is arranged between the carrier 2 and the semiconductor body 1. Moreover, a mirror layer 5 and an intermediate layer 6 are arranged between the semiconductor body 1 and the carrier 2. In FIG. 2, the first main surface 1A is structured. Furthermore, the semiconductor chip 10 comprises a first connection layer 8 extending from the side surface 1C to the first main surface 1A for the purpose of electrically contacting the semiconductor chip. For the purpose of electrically insulating the outer surface 1E of the semiconductor body 1 from the first connection layer 8, an insulation layer 7 is arranged at least regionally between the side surface 1C and the first connection layer 8. The insulation layer 7 is composed of the first electrically insulating partial layer 71 and the second electrically insulating partial layer 72. The first partial layer 71 and the second partial layer 72 can be produced in a common method step or in a plurality of different method steps.

By way of example, a thickness of the intermediate layer 6 is 1 µm to 10 µm, preferably 3 µm to 7 µm. The steplike structure 42 has a lateral extent and a vertical extent. In particular, the vertical extent of the steplike structure 42 and the thickness of the intermediate layer 6 are of identical magnitude. By way of example, the lateral extent of the steplike structure 42 is 2 µm to 20 µm, preferably 2 µm to 10 µm.

The mirror layer 5 is reflective for the radiation generated in the active layer 13. By way of example, the mirror layer comprises a metal. For example, the mirror layer 5 contains aluminum, rhodium, palladium or silver. The mirror layer 5 is arranged between the semiconductor body 1 and the intermediate layer 6. During operation of the semiconductor chip, the mirror layer 5 reflects electromagnetic radiations in the direction of the first main surface 1A. In particular, the mirror layer 5 reflects at least 60%, preferably at least 80%, particularly preferably at least 90%, of a visible proportion of the spectrum of the radiation generated by the active layer 13. In a lateral direction, the mirror layer 5 is completely surrounded by the first partial layer 71. In a plan view of the carrier 2, the semiconductor body 1 completely covers the mirror layer 5. Furthermore, the semiconductor body 1 at least partly covers the first partial layer 71.

The intermediate layer 6 is arranged between the mirror layer 5 and the carrier 2. The intermediate layer 6 has a larger cross section than the mirror layer 5 and the semiconductor body 1. If the mirror layer 5 and the semiconductor body 1 are soldered onto the carrier 2, the intermediate layer 6 can contain a solder resist layer, for example. The intermediate layer 6 thus prevents solder material from penetrating into the mirror layer 5 or into the semiconductor body 1. It is also possible for the intermediate layer 6 to contain an adhesive layer or an adhesive layer, the semiconductor body 1 being fixed to the carrier 2 by the adhesive layer. The intermediate layer 6 has an elevation 61 at the edge such that the first partial layer 71 is arranged between the elevation 61 of the intermediate layer 6 and the mirror layer 5 in a lateral direction. In particular, the extent of the first partial layer 71 in the lateral direction is delimited by the mirror layer 5 and the elevation 61 of the intermediate layer 6.

The carrier 2 directly adjoins the intermediate layer 6. The intermediate layer 6 can be a monolayer. Alternatively, the intermediate layer can comprise a plurality of layers. The carrier 2 has a larger cross section than the intermediate layer 6 such that the carrier 2 and the intermediate layer 6 form a steplike structure 42 on the side surface 1C of the semiconductor chip. It is also possible for the carrier 2 to have a cross section identical to that of the intermediate layer 6 at an interface with the intermediate layer 6 and to have a larger cross section than the intermediate layer 6 at the rear side 1D. The steplike structure 42 thus forms an anchoring structure 4 of the side surface 1C. In FIG. 2, the steplike structure 42 is completely covered by the second electrically insulating partial layer 72. The second partial layer 72 extends regionally onto an outer surface 1E of the semiconductor body. The outer surface 1E of the semiconductor body is inclined relative to the second main surface 1B. In sectional view, the semiconductor body 1 is trapezoidal. In a departure from the example described in FIG. 2, the side surface 1C can have undulations, roughnesses, indentations and/or protrusions, for example, between the intermediate layer 6 and the rear side 1D.

The first main surface 1A is in particular a radiation exit surface. The first main surface 1A contains structure elements, wherein the structure elements have a structure size which, in particular, is greater than or equal to a peak wavelength of the radiation generated in the active layer 13 during operation and less than or equal to ten times the peak wavelength.

The semiconductor chip 10 illustrated in FIG. 2 is a thin-film semiconductor chip. In other words, a growth substrate on which the semiconductor layers of the semiconductor body 1 are deposited epitaxially is completely or partly removed. The carrier 2 described in FIG. 2 is different from the growth substrate.

Figure 3:
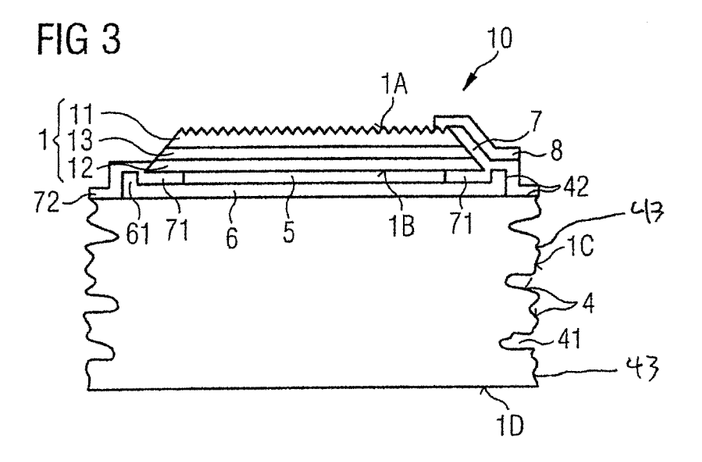
FIG. 3 shows a further example of an optoelectronic semiconductor chip in schematic sectional view.

FIG. 3 schematically illustrates a further example of an optoelectronic semiconductor chip. This example substantially corresponds to the example of a semiconductor chip in FIG. 2. In contrast thereto, the anchoring structure 4 has additional indentations 41 alongside the steplike structure 42. The indentations 41 are formed in the carrier 2 and spatially spaced apart from one another in the vertical direction. The indentations 41 in FIG. 3 correspond to the indentations illustrated in FIG. 1.

Figure 4:
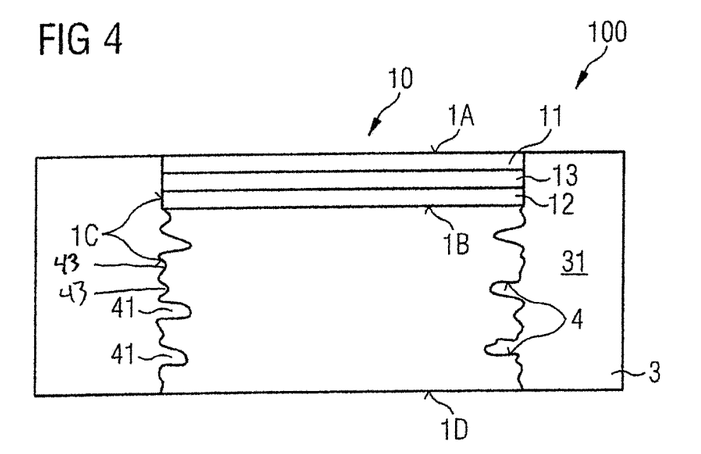
FIG. 4 shows one example of an optoelectronic component in schematic sectional view.

FIG. 4 schematically illustrates one example of an optoelectronic component 100 in sectional view.

The optoelectronic component 100 comprises a semiconductor chip 10 and a housing body 3. The semiconductor chip 10 corresponds to the semiconductor chip in FIG. 1. The housing body 3 encloses the semiconductor chip 10 in a lateral direction. The housing body 3 comprises a housing material 31 that engages into the anchoring structure 4. Preferably, the housing material 31 completely covers the indentations 41. By way of example, the housing material 31 completely fills the indentations 41.

The housing material 31 can be radiation-nontransmissive or radiation-transmissive. In particular, the housing material 31 can be reflective for the radiation generated by the active layer 13. By way of example, the housing material 31 contains titanium oxide. The first main surface 1A of the semiconductor chip 10 is free of the housing body 3. The rear side 1D of the semiconductor chip is free of the housing body 3. The housing body 3 completely covers the side surface 1C between the rear side 1D of the semiconductor chip and the second main surface 1B. The first main surface 1A is a radiation exit surface of the semiconductor chip. That is to say that the radiation generated during operation of the semiconductor chip emerges from the semiconductor chip 10 or from the optoelectronic component 100 at the main surface 1A. The housing body 3 terminates flush with the first main surface 1A of the semiconductor chip in a vertical direction. Furthermore, the housing body 3 terminates flush with the rear side 1D of the semiconductor chip. In other words, the semiconductor chip 10 and the housing body have an identical height. The housing body 3 is thus fixed only to the side surface 1C of the semiconductor chip 10 such that the component 100 has the smallest possible height. The stability of the component 100 is improved by the anchoring structure 4 and the housing body 3 engaging into the indentations 41. It is also possible for the semiconductor chip 10 to have a larger height than the housing body 3. In particular, the semiconductor body 1 can project at least partly beyond the housing body 3.

Figure 5:
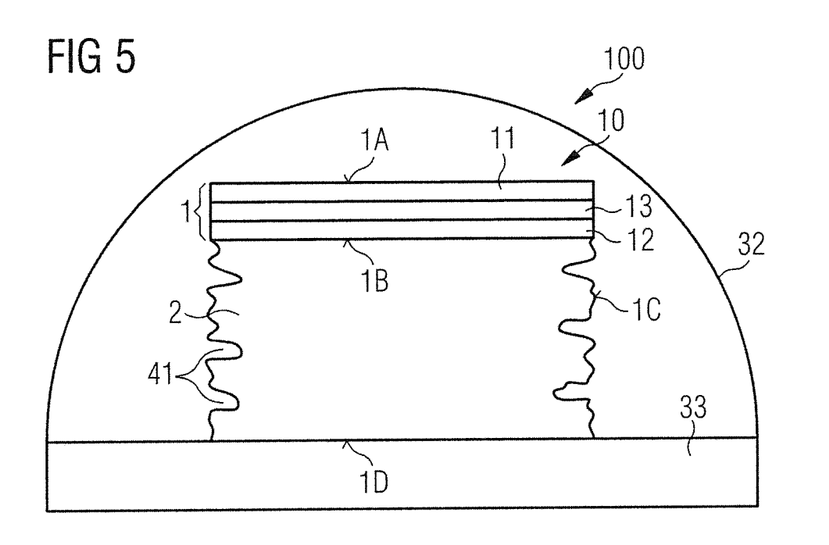
FIG. 5 shows a second example of an optoelectronic component in schematic sectional view.

FIG. 5 schematically illustrates a second example of an optoelectronic component 100 in sectional view.

The optoelectronic component 100 comprises a semiconductor chip and an optical element 32. The optical element 32 comprises or consists of a radiation-transmissive material. The optical element 32 has the form of a lens. The semiconductor chip 10 corresponds by way of example to the semiconductor chip in FIG. 1. The semiconductor chip 10 and the optical element 32 are arranged on a common connection carrier 33. The common connection carrier 33 can comprise conductor tracks that electrically contact the semiconductor chip 10. The optical element 32 encloses the side surface 1C and covers the first main surface 1A of the semiconductor chip 10 completely. The optical element 32 engages into the anchoring structure 4 and is anchored with the semiconductor chip 10. In FIG. 5, the semiconductor chip 10 is embedded into the optical element 32 and completely enclosed by the optical element 32 and the connection carrier 33.

Figure 6:
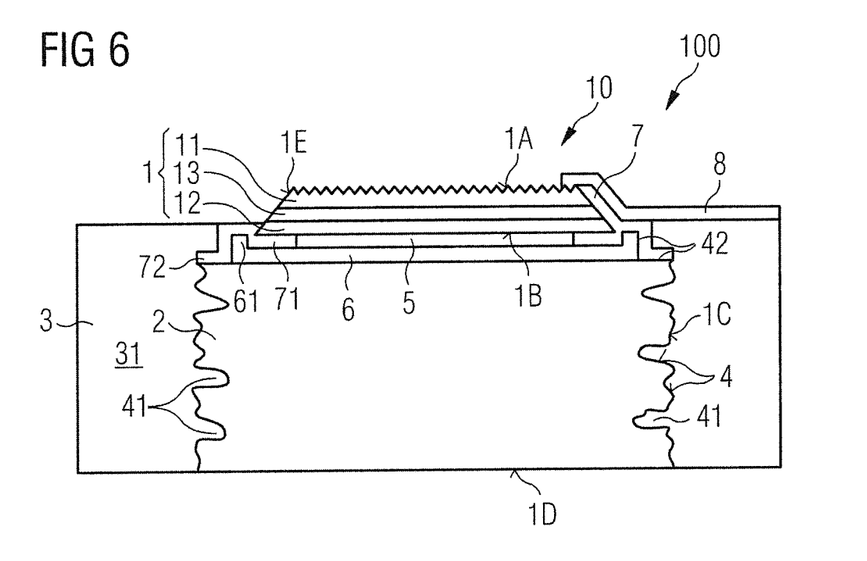
FIG. 6 shows a further example of an optoelectronic component in schematic sectional view.

FIG. 6 schematically illustrates a third example of an optoelectronic component 100 in sectional view. This example substantially corresponds to the first example of the optoelectronic component in FIG. 4. In contrast thereto, the semiconductor chip 10 by way of example does not correspond to the semiconductor chip in FIG. 1, but rather to the semiconductor chip in FIG. 3. Furthermore, the semiconductor chip 10 has a larger height than the housing body 3. The semiconductor chip 10 projects partly beyond the housing body 3 with the semiconductor body 1. The housing body 3 engages into the anchoring structure 4. The anchoring structure 4 has a plurality of indentations 41 and a steplike structure 42. The steplike structure 42 is laterally enclosed by the housing body 3. The housing body 3 projects beyond the second main surface 1B of the semiconductor body 1 in a vertical direction. The first connection layer 8 extends from a surface of the housing body 3 over the outer surface 1E of the semiconductor body to the first main surface of the semiconductor body. The rear side 1D of the semiconductor chip is free of the housing body 3. The semiconductor chip 10 can thus electrically contact an external current source via the rear side 1D of the semiconductor chip and the first connection layer 8.

A first example of a method of producing a plurality of optoelectronic semiconductor chips is schematically illustrated in sectional views in FIGS. 7A to 7D.

Figure 7A:
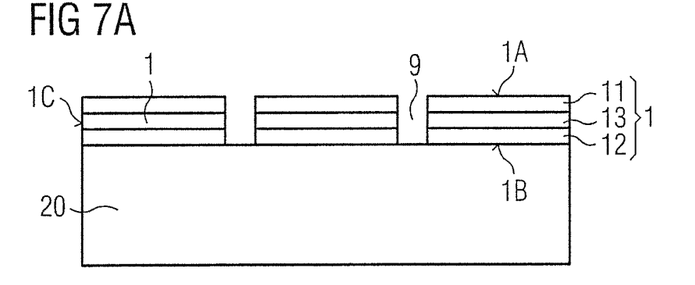
FIGS. 7A to 7D show schematic sectional views of different method stages of a first example of a method of producing a plurality of semiconductor chips.

In FIG. 7A, a plurality of semiconductor bodies 1 are provided on a common carrier plate 20. The semiconductor bodies 1 are arranged alongside one another. The semiconductor bodies 1 have an active layer 13 that generates electromagnetic radiation, a first semiconductor layer 11 and a second semiconductor layer 12. The semiconductor layer 13 is arranged between the first semiconductor layer 11 and the second semiconductor layer 12. The semiconductor bodies 1 have a first main surface 1A facing away from the common carrier plate 20 and a second main surface 1B facing the common carrier plate.

The semiconductor bodies 1 are separated from one another by at least one trench 9. The semiconductor bodies 1 can originate from a common semiconductor layer sequence, the semiconductor layer sequence being subdivided into a plurality of semiconductor bodies 1 by a plurality of trenches 9 (the so-called mesa trenches) in a further method step. The common carrier plate 20 can be a growth substrate on which the semiconductor layers of the semiconductor body 1 are deposited. Alternatively, the common carrier plate 20 can be different than the growth substrate. By way of example, the common carrier plate 20 comprises a material such as silicon or germanium or consists of one of the materials. For example, the semiconductor bodies 1 are rebonded onto the common carrier plate 20 after the semiconductor layers have been deposited.

Figure 7B:
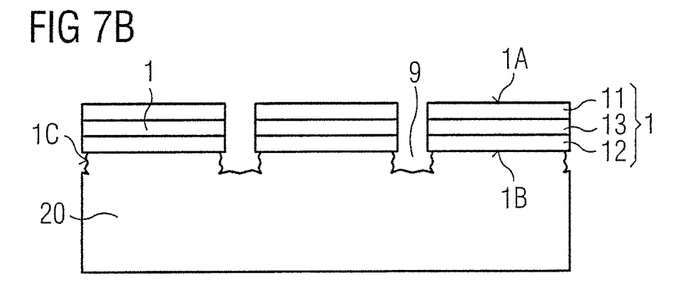
Figure 7C:
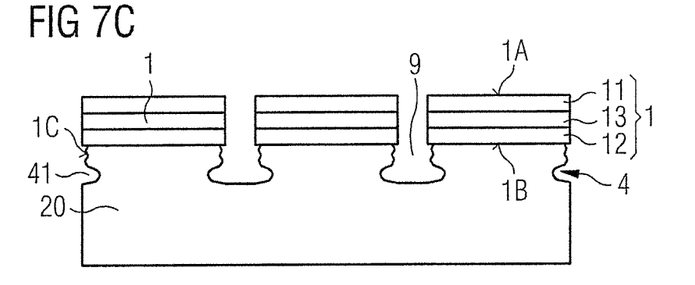

FIGS. 7B and 7C schematically illustrate the process of forming a plurality of indentations 41 of the anchoring structure 4. The process of forming the anchoring structure 4 is carried out during the process of singulating the semiconductor chips 10. In particular, this is done by at least one isotropically acting chemical method and one anisotropically acting chemical method. For example, the common carrier plate 20 is etched such that indentations 41 are formed in the common carrier plate. In FIG. 7B, deep etching is firstly carried out in the region of the trench 9, for instance, by an anisotropic dry-chemical etching process. For example, the so-called Bosch process is used for the deep etch. In this process, a material of the common carrier plate 20 is dry-chemically removed, the side walls of the already etched trenches being coated with a protective layer that protects against further etches. In FIG. 7C, an isotropically acting chemical method, for instance an isotropic dry-chemical etch, is carried out along the trench 9. By the isotropic etch, in particular deep etch, the material of the common carrier plate 20 is removed from all directions such that at least one indentation 41 is formed in the common carrier plate 20.

The isotropically acting chemical method and the anisotropically acting method are carried out alternately such that a plurality of indentations 41 are formed along the trench. For example, the anchoring structure 4 is formed in a stepwise manner by alternately isotropic and anisotropic etches, in particular deep etches.

If the common carrier plate 20 is severed by the trench 9 or a plurality of trenches 9, a plurality of semiconductor chips 10 arise. The semiconductor chips 10 described in FIG. 7D correspond by way of example to the semiconductor chip described in FIG. 1.

A further example of a method of producing a plurality of semiconductor chips 1 is schematically illustrated in sectional views in FIGS. 8A to 8E.

Figure 8A:
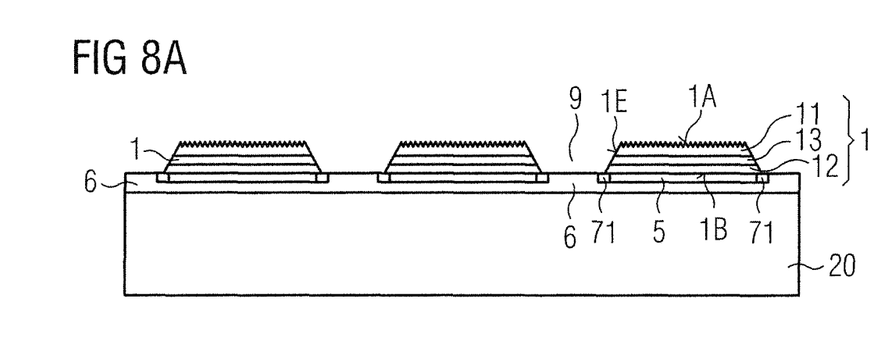
FIGS. 8A to 8E show schematic sectional views of different method stages of a second example of a method of producing a plurality of semiconductor chips.

The semiconductor bodies 1 on a common carrier plate 20 in FIG. 8A substantially correspond to the semiconductor bodies illustrated in FIG. 7A. In contrast thereto, the first main surface 1A of the semiconductor bodies 1 is structured. Furthermore, the semiconductor bodies 1 have an obliquely formed outer surface 1E. The inclined outer surfaces 1E can be formed by flattening the trench 9 between the adjacent semiconductor bodies 1. The trench 9 in the region between the semiconductor bodies 1 thereby has a cross section which increases with increasing distance from the common carrier plate 20.

An intermediate layer 6 is arranged between the common carrier plate 20 and the semiconductor bodies 1. A mirror layer 5 is formed between each semiconductor body 1 and the common carrier plate 20. In a plan view of the common carrier plate 20, the semiconductor body 1 completely covers the associated mirror layer 5. The mirror layer 5 is completely surrounded by a first electrically insulating partial layer 71 in the lateral direction. The semiconductor body 1 partly covers the first partial layer 71. The intermediate layer 6 has a plurality of openings, wherein a mirror layer 5 and a first electrically insulating partial layer 71 are arranged in each opening.

Figure 8B:
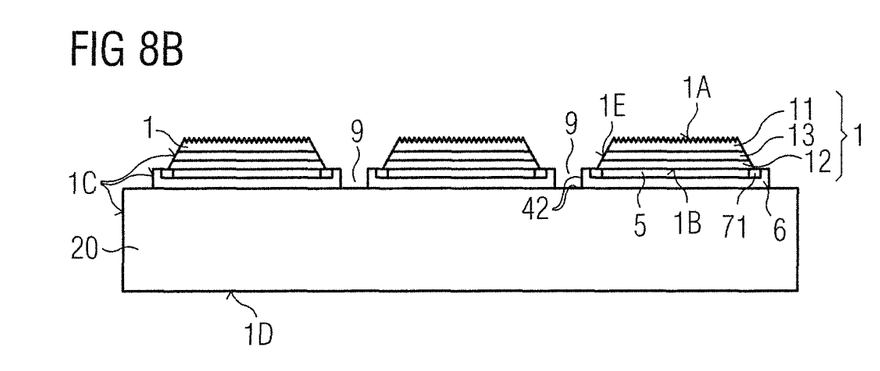

In FIG. 8B, the intermediate layer 6 is structured. By the structuring, the continuous intermediate layer 6 is subdivided into a plurality of mutually spaced apart intermediate layers 6 of the semiconductor chips 1. In other words, the trench 6 is deepened by the structuring of the intermediate layer 6, wherein the trench 9 extends through the intermediate layer 6 after the structuring. In the region of the trench 9, the side surface 1C has an anchoring structure 4, wherein the anchoring structure 4 contains a steplike structure 42. The steplike structure 42 is formed by the intermediate layer 6 and the common carrier plate 20. The anchoring structure 4, in particular the steplike structure 42, is thus at least partly formed before the process of singulating the semiconductor chips 10. In this case, the second main surface 1B is arranged between the first main surface 1A and the steplike structure 42.

In a departure from the example illustrated in FIG. 8B, the trench 9 can extend into the common carrier plate 20. In other words, during the structuring of the intermediate layer 6, the common carrier plate is likewise structured, such that the trench 9 is partly formed in the common carrier plate 20.

Figure 8C:
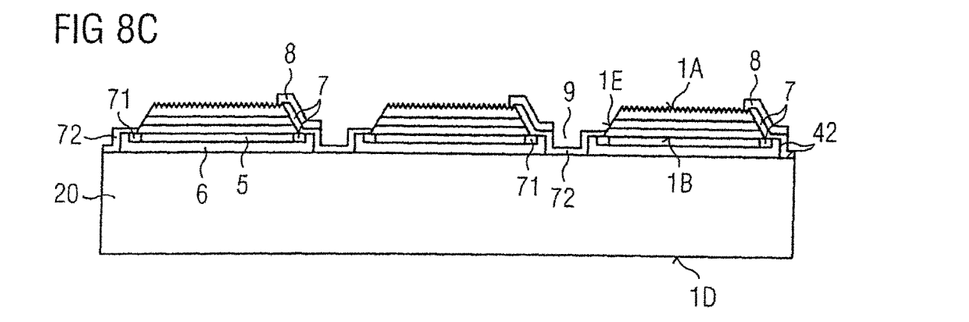

In FIG. 8C, first, a second electrically insulating partial layer 72 is formed in the region of the trench 9. The second partial layer 72 completely covers the trench 9. Furthermore, the steplike structure 42 is completely covered by the second partial layer. The second partial layer 72 is applied to the semiconductor bodies 1 such that the second partial layer 72 at least regionally covers the outer surface 1E of the semiconductor body 1. Moreover, the second partial layer 72 adjoins the first electrically insulating partial layer 71. Together with the first partial layer 71 the second partial layer 72 forms the insulation layer 7 of the semiconductor chip 10.

A first connection layer 8 is formed on the semiconductor bodies 1. The first connection layer 8 forms an electrical contact with the first main surface 1A such that the semiconductor body 1 can electrically contact an external current source via the first connection layer 8. The first connection layer 8 at least partly extends on the outer surface 1E of the semiconductor body 1, wherein the second partial layer 72 is arranged between the first connection layer 8 and the outer surface 1E of the semiconductor body. On account of the complete covering of the trench by the second partial layer, a direct electrical contact between the first connection layer 8 and the carrier 2 is prevented. A separate insulating underlay of the first connection layer particularly in the region of the steplike structure 42 can thus be dispensed with.

Figures 8D, 8E:
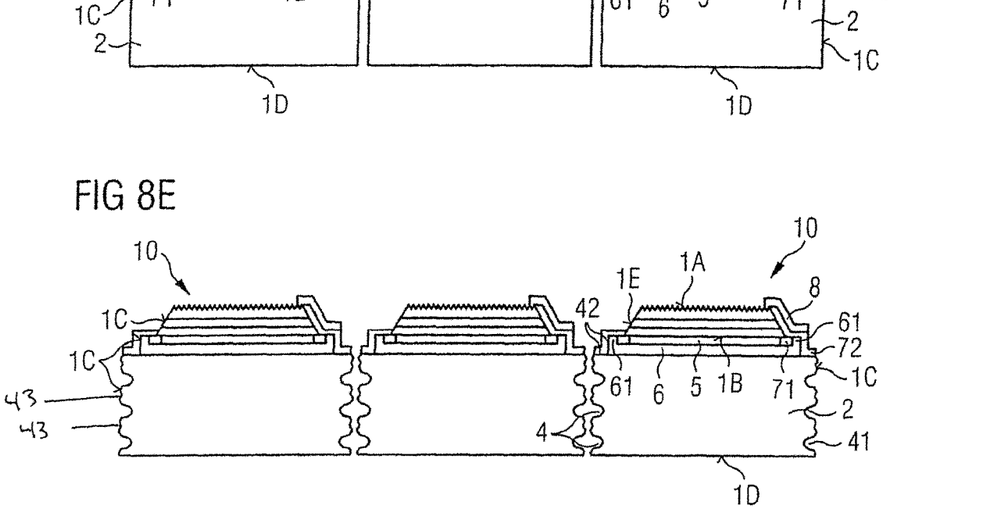

The semiconductor chips 10 are singulated in FIG. 8D. The common carrier plate 20 is severed in this case along the trench 9 or along the trenches 9. The singulated semiconductor chips 10 correspond to the semiconductor chips illustrated in FIG. 2, wherein the semiconductor chips 10 comprise an anchoring structure 4 having a steplike structure 42. Severing the common carrier plate 20 can be realized, for example, by laser separation or by an anisotropically acting chemical method, for instance, the Bosch method.

Figure 7D:
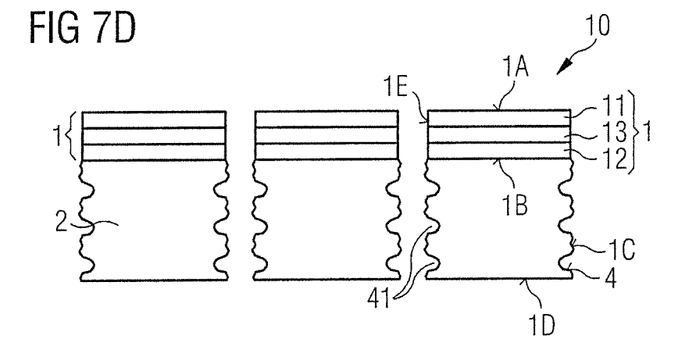

Furthermore, the singulation process illustrated in FIGS. 7B to 7D can be employed after the first connection layer 8 has been applied such that the anchoring structure 4 has one or a plurality of indentations 41 in addition to the steplike structure 42. The singulated semiconductor chips 10 are illustrated in FIG. 8E, the singulated semiconductor chips 10 corresponding to the semiconductor chip described in FIG. 3.

A molding compound is molded around the optoelectronic semiconductor chips 10 for the purpose of forming a housing body 3 or an optical element 32. The molding compound engages in particular into the anchoring structure 4 such that a connection having sufficient stability is produced between the semiconductor chip 10 and the housing body 3 or the optical element 32 by lateral anchoring.

By a lateral anchoring structure of a semiconductor chip, which anchoring structure has a steplike structure and/or at least one indentation in the carrier of the semiconductor chip, the stability of an optoelectronic component comprising the semiconductor chip and a molding compound is increased. Anchoring the molding compound laterally with respect to the semiconductor chip achieves a sufficient mechanically stable connection between the semiconductor chip and the molding compound even if a front side and a rear side of the semiconductor chip are free of the molding compound.

This application claims priority of DE 10 2013 107 967.9, the content of which is hereby incorporated by reference.

Our chips, components and methods are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic component comprising an optoelectronic semiconductor chip and a housing body, said optoelectronic semiconductor chip comprising a carrier and a semiconductor body having an active layer that generates electromagnetic radiation during operation of the optoelectronic semiconductor chip, wherein the semiconductor body is arranged on the carrier, the semiconductor body has a first main surface facing away from the carrier and a second main surface facing the carrier, a side surface of the optoelectronic semiconductor chip has an anchoring structure, the second main surface is arranged between the first main surface and the anchoring structure, the side surface has roughnesses, the anchoring structure comprises a plurality of indentations formed in the carrier and spatially arranged apart from one another in a vertical direction, wherein a cross section of the indentations is at least three times larger than a cross section of the roughnesses of the side surface, and a depth of the indentations is at least three times larger than a depth of the roughnesses of the side surface, said depth of the indentation being a lateral extent of the indentation into the carrier, and the housing body encloses the optoelectronic semiconductor chip in a lateral direction such that a material of the housing body engages into the anchoring structure, and the first main surface and a rear side of the optoelectronic semiconductor chip are free of the material of the housing body.

2. The optoelectronic component according to claim 1, wherein the indentations are formed in the carrier and a structure size being a depth or a width of the indentations is between 2 μm and 20 μm inclusive.

3. The optoelectronic component according to claim 1, wherein the indentations have different structure sizes and are spaced apart vertically from the second main surface, wherein with increasing distance from the second main surface, the indentations have structure sizes having increasing depth and width.

4. The optoelectronic component according to claim 1, wherein the semiconductor chip is not covered by a growth substrate, and a mirror layer is arranged between the active layer and the carrier.

5. The optoelectronic component according to claim 4, wherein, in a sectional view of the optoelectronic semiconductor chip, the mirror layer is delimited by a first electrically insulating partial layer in a lateral direction and the semiconductor body partly covers the first electrically insulating partial layer and completely covers the mirror layer.

6. The optoelectronic component according to claim 1, wherein the housing body terminates flush with a rear side of the optoelectronic semiconductor chip in the vertical direction and the optoelectronic semiconductor chip and the housing body have an identical height, or the optoelectronic semiconductor chip has a larger height than the housing body such that the semiconductor body projects at least partly beyond the housing body.

7. An optoelectronic semiconductor chip comprising a carrier and a semiconductor body having an active layer that generates electromagnetic radiation during operation of the optoelectronic semiconductor chip, wherein the semiconductor body is arranged on the carrier, the semiconductor body has a first main surface facing away from the carrier and a second main surface facing the carrier, a side surface of the optoelectronic semiconductor chip has an anchoring structure, the second main surface is arranged between the first main surface and the anchoring structure, the side surface has roughnesses, the anchoring structure comprises a plurality of indentations formed in the carrier and spatially arranged apart from one another in a vertical direction, wherein a cross section of the indentations is at least three times larger than a cross section of the roughnesses of the side surface, and a depth of the indentations is at least three times larger than a depth of the roughnesses of the side surface, said depth of the indentation being a lateral extent of the indentation into the carrier, and a mirror layer is arranged between the active layer and the carrier, wherein, in a sectional view of the optoelectronic semiconductor chip, the mirror layer is delimited by a first electrically insulating partial layer in a lateral direction, said first electrically insulating partial layer being arranged in the vertical direction between the semiconductor body and the carrier, and wherein the semiconductor body partly covers the first electrically insulating partial layer and completely covers the mirror layer.

8. An optoelectronic component comprising the optoelectronic semiconductor chip according to claim 7 and a housing body, wherein the housing body encloses the optoelectronic semiconductor chip in a lateral direction such that the housing body engages into the anchoring structure on the side surface of the optoelectronic semiconductor chip, the housing body completely covers the side surface of the optoelectronic semiconductor chip at least between a rear side of the optoelectronic semiconductor chip and the second main surface of the semiconductor body, and the first main surface of the semiconductor body is free of the housing body.

9. An optoelectronic component comprising a semiconductor chip according to claim 7 and an optical element, wherein the optical element encloses the semiconductor chip in a lateral direction such that the optical element engages into the anchoring structure, the optical element has the form of a lens, and the optical element completely covers the first main surface and the side surface.

10. An optoelectronic component comprising the optoelectronic semiconductor chip according to claim 7 and a housing body, wherein the housing body encloses the optoelectronic semiconductor chip in a lateral direction such that a material of the housing body engages into the anchoring structure.

11. The optoelectronic component according to claim 10, wherein the housing body terminates flush with a rear side of the optoelectronic semiconductor chip in the vertical direction and the first main surface of the semiconductor body or of the optoelectronic semiconductor chip in the vertical direction.

12. The optoelectronic component according to claim 7, wherein a region of the first electrically insulating partial layer covered by the semiconductor body is arranged in the vertical direction between the semiconductor body and the carrier.

13. The optoelectronic component according to claim 10, wherein the optoelectronic semiconductor chip and the housing body have an identical height.

* * * * *